(12) United States Patent
Wuister et al.

(10) Patent No.: US 9,666,443 B2
(45) Date of Patent: May 30, 2017

(54) METHODS FOR PROVIDING LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventors: Sander Frederik Wuister, Eindhoven (NL); Emiel Peeters, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/769,426

(22) PCT Filed: Feb. 26, 2014

(86) PCT No.: PCT/EP2014/053692
§ 371 (c)(1),
(2) Date: Aug. 20, 2015

(87) PCT Pub. No.: WO2014/139793
PCT Pub. Date: Sep. 18, 2014

(65) Prior Publication Data
US 2015/0380266 A1    Dec. 31, 2015

Related U.S. Application Data
(60) Provisional application No. 61/792,538, filed on Mar. 15, 2013.

(51) Int. Cl.
*H01L 21/31* (2006.01)
*H01L 21/3105* (2006.01)
(Continued)

(52) U.S. Cl.
CPC .... *H01L 21/31058* (2013.01); *B81C 1/00031* (2013.01); *G03F 7/0002* (2013.01);
(Continued)

(58) Field of Classification Search
CPC ............ H01L 21/0271; H01L 21/0274; H01L 21/0337; H01L 21/31058; H01L 21/76802; H01L 21/76816
(Continued)

(56) References Cited

U.S. PATENT DOCUMENTS 7,605,081 B2    10/2009  Yang et al.
2008/0176767 A1    7/2008  Millward
(Continued)

FOREIGN PATENT DOCUMENTS

CN    101894794    11/2010
JP    2010-269304    12/2010
(Continued)

OTHER PUBLICATIONS

Korean Office Action dated Oct. 14, 2016 in corresponding Korean Patent Application No. 10-2015-7029517.
(Continued)

*Primary Examiner* — Matthew E Warren
(74) *Attorney, Agent, or Firm* — Pillsbury Winthrop Shaw Pittman LLP

(57) ABSTRACT

Causing a self-assemblable block copolymer (BCP) having first and second blocks to migrate from a region surrounding a lithography recess of the substrate and a dummy recess on the substrate to within the lithography recess and the dummy recess, causing the BCP to self-assemble into an ordered layer within the lithography recess, the layer having a first block domain and a second block domain, and selectively removing the first domain to form a lithography feature having the second domain within the lithography recess, wherein a width of the dummy recess is smaller than the minimum width required by the BCP to self-assemble, the dummy recess is within the region of the substrate surrounding the lithography recess from which the BCP is caused to
(Continued)

migrate, and the width between portions of a side-wall of the lithography recess is greater than the width between portions of a side-wall of the dummy recess.

19 Claims, 4 Drawing Sheets

(51) Int. Cl.
*B81C 1/00* (2006.01)
*H01L 21/027* (2006.01)
*H01L 21/033* (2006.01)
*G03F 7/00* (2006.01)
*H01L 21/768* (2006.01)

(52) U.S. Cl.
CPC ...... *H01L 21/0271* (2013.01); *H01L 21/0274* (2013.01); *H01L 21/0337* (2013.01); *H01L 21/76802* (2013.01); *B81C 2201/0149* (2013.01)

(58) Field of Classification Search
USPC .......................... 257/622, 632; 438/778, 780
See application file for complete search history.

(56) References Cited

U.S. PATENT DOCUMENTS

| | | |
|---|---|---|
| 2008/0311347 A1 | 12/2008 | Millward et al. |
| 2010/0167214 A1 | 7/2010 | Yoon et al. |
| 2010/0294740 A1 | 11/2010 | Cheng et al. |
| 2010/0323096 A1 | 12/2010 | Sills et al. |
| 2012/0058435 A1 | 3/2012 | Seino et al. |

FOREIGN PATENT DOCUMENTS

| | | |
|---|---|---|
| JP | 2014-078540 | 5/2014 |
| KR | 10-2010-0079948 | 7/2010 |
| KR | 10-2010-0126190 | 12/2010 |
| WO | 2010/055601 | 5/2010 |
| WO | 2012/106121 | 8/2012 |

OTHER PUBLICATIONS

International Search Report mailed Jul. 23, 2014 in corresponding International Patent Application No. PCT/EP2014/053692.
Miri Park et al., "Block Copolymer Lithography: Periodic Arrays of ~$10^{11}$ Holes in 1 Square Centimeter," Science, vol. 276, pp. 1401-1401 (May 30, 1997).
Chinese Office Action dated Dec. 1, 2016 in corresponding Chinese Patent Application No. 201480015196.X.

METHODS FOR PROVIDING LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2014/053692, which was filed on Feb. 26, 2014, which claims the benefit of priority of U.S. provisional application No. 61/792,538, which was filed on Mar. 15, 2013, and which is incorporated herein in its entirety by reference.

FIELD

The present invention relates to a method of forming a lithography feature on a substrate, by use of self-assembly of a block copolymer in a recess provided on the substrate.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In projection photolithography, the push for smaller features has resulted in the development of technologies such as immersion lithography and extreme ultraviolet (EUV) lithography.

As an alternative, so-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both projection photolithography and for imprint lithography, it is desirable to provide high resolution patterning of surfaces, for example of an imprint template or of other substrates. The use of self-assembly of a block copolymers (BCP) has been considered as a potential method for increasing the feature resolution to a smaller dimension than that obtainable by prior lithography methods or as an alternative to electron beam lithography for preparation of imprint templates.

A self-assemblable BCP is a compound useful in nanofabrication because it may undergo an order-disorder transition on cooling below a certain temperature (order-disorder transition temperature $T_{o/d}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymer.

The feasibility of using a thin film of BCP as a self-assembling template was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A BCP comprises different blocks, each typically comprising one or more identical monomers, and arranged side-by side along the polymer chain. Each block may contain many monomers of its respective type. So, for instance, an A-B BCP may have a plurality of type A monomers in the (or each) A block and a plurality of type B monomers in the (or each) B block. An example of a suitable BCP is, for instance, a polymer having covalently linked blocks of polystyrene (PS) monomer (hydrophobic block) and polymethylmethacrylate (PMMA) monomer (hydrophilic block). Other BCPs with blocks of differing hydrophobicity/hydrophilicity may be useful. For instance a tri-block copolymer such as (A-B-C) BCP may be useful, as may an alternating or periodic BCP e.g. [-A-B-A-B-A-B-]$_n$ or [-A-B-C-A-B-C]$_m$ where n and m are integers. The blocks may be connected to each other by covalent links in a linear or branched fashion (e.g., a star or branched configuration).

A BCP may form many different phases upon self-assembly, dependent upon the volume fractions of the blocks, degree of polymerization within each block type (i.e. number of monomers of each respective type within each respective block), the optional use of a solvent and surface interactions. When applied in a thin film, geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled BCPs.

The phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At a 50:50 ratio, a lamellar phase is formed. With a ratio of 30:70 an inverted cylindrical phase may be formed and at a ratio of 20:80, an inverted cubic phase may be formed.

Suitable BCPs for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetra-block or other multi-block copolymer.

One method used to guide or direct self-assembly of a polymer (such as a BCP) onto a substrate surface is known as graphoepitaxy. This method involves the self-organization of a BCP guided by topological pre-patterning on the substrate using one or more features constructed of resist (or one or more features transferred from resist onto a substrate surface, or one or more features transferred onto a film stack deposited on the substrate surface). The pre-patterning is used to form an enclosure or "recess" comprising a substrate base and a sidewall, e.g., a pair of opposing side-walls, of resist (or a side-wall formed in a film or a side-wall formed in the substrate).

Typically, the height of a feature of a graphoepitaxy template is of the order of the thickness of the BCP layer to be ordered, so may be, for instance, from about 20 nm to about 150 nm.

A lamellar self-assembled BCP can form a parallel linear pattern of lithography features with adjacent lines of the different polymer block domains in the recesses. For instance if the BCP is a di-block copolymer with A and B blocks within the polymer chain, the BCP may self-assemble into an ordered layer in each recess, the layer comprising regularly spaced first domains of A blocks, alternating with second domains of B blocks.

Similarly, a cylindrical self-assembled BCP can form an ordered pattern of lithography features comprising cylindrical discontinuous first domains surrounded by a second continuous domain. For instance, if the BCP is a di-block copolymer with A and B blocks within the polymer chain, the A block may assemble into a cylindrical discontinuous domain within a circular recess and surrounded by a continuous domain of B block. Alternatively, the A block may assemble into cylindrical discontinuous domains regularly spaced across a linear recess and surrounded by a continuous domain of B block.

Graphoepitaxy may be used, therefore, to guide the self-organization of lamellar or cylindrical phases such that the BCP pattern subdivides the spacing of the side wall(s) of a recess into domains of discrete copolymer patterns.

In a process to implement the use of BCP self-assembly in nanofabrication, a substrate may be modified with a neutral orientation control layer, as part of the graphoepitaxy template, to induce the preferred orientation of the self-assembly pattern in relation to the substrate. For some BCPs used in self-assemblable polymer layers, there may be a preferential interaction between one of the blocks and the substrate surface that may result in orientation. For instance, for a polystyrene(PS)-b-PMMA BCP, the PMMA block will preferentially wet (i.e. have a high chemical affinity with) an oxide surface and this may be used to induce the self-assembled pattern to lie oriented substantially parallel to the plane of the surface. Substantially normal orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "normal orientation" it is meant that the domains of each block will be positioned side-by-side at the substrate surface, with the interfacial regions between adjacent domains of different blocks lying substantially perpendicular to the plane of the surface.

In a graphoepitaxy template for aligning a di-block copolymer having A and B blocks, where A is hydrophilic and B is hydrophobic in nature, the graphoepitaxy pattern may comprise hydrophobic resist side-wall features, with a neutral orientation base between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm.

A thin layer of self-assemblable BCP may be deposited onto a substrate having a graphoepitaxy template as set out above. A suitable method for deposition of the self-assemblable polymer is spin-coating, as this process is capable of providing a well-defined, uniform, thin layer of self-assemblable polymer. A suitable layer thickness for a deposited self-assemblable polymer film is approximately 10 nm to 150 nm.

Following deposition of the BCP film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a BCP is a process where the assembly of many small components (the BCP) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B BCP, with the driving force for phase separation described by Flory-Huggins theory for the system under consideration. The use of graphoepitaxy may greatly reduce defect formation. The Flory-Huggins interaction parameter (chi value), and the degree of polymerization of the BCP blocks (N value) are parameters of the BCP which affect the phase separation, and the dimensions with which self-assembly of a particular BCP occurs.

For a polymer which undergoes self-assembly, the self-assemblable polymer will exhibit an order-disorder temperature To/d. To/d may be measured by any suitable technique for assessing the ordered/disordered state of the polymer, such as differential scanning calorimetry (DSC). If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature Tg below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature To/d for the polymer.

Ordering and defect annihilation may be combined into a single annealing process or a plurality of processes may be used in order to provide a layer of self-assembled polymer such as BCP, having an ordered pattern of domains of differing chemical type (of domains of different block types).

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the features of the second domain type. A pattern having parallel cylindrical phase domains can be etched using a dry etching or reactive ion etching technique. A pattern having lamellar phase domains can utilize a wet etching technique in addition to or as an alternative to those suitable for the etching of parallel cylindrical phase domains.

Following the breakthrough etching, the pattern may be transferred by so-called transfer etching using an etching means which is resisted by the second domain type and so forms recesses in the substrate surface where the surface has been laid bare.

Spacing between lithography features is known as pitch—defined as the width of one repeat unit of the lithography feature (i.e. feature width plus inter-feature spacing). A self-assembly process using a BCP can be used to produce lithography features with particularly low pitch, typically less than 30-50 nm.

SUMMARY

FIGS. 1A and 1B show, in plan view and cross-section respectively, part of a substrate 1 to which a lithography process using self-assembly of a BCP is applied. An anti-reflection coating may be present on the surface of the substrate 1. The anti-reflection coating (if present) may be an organic material, such as, for example, ARC 29, from Brewer Science. Alternatively, the anti-reflection coating may be an inorganic material such as, for example, SiC or SiON. A layer of photo-resist 2 is applied to the substrate 1. The layer of photo-resist 2 is patterned with a plurality of contact hole resist recesses 3, 4, 5.

In FIG. 1C, a BCP layer 6 has been deposited onto the substrate 1 and the photo-resist 2. The BCP layer 6 is shown with a uniform thickness within each of the photo-resist recesses 3, 4, 5, and on top of the photo-resist 2. In FIGS. 1D and 1E, which show cross-section and plan views respectively, the BCP layer 6 has been thermally annealed. The thermal annealing process causes a redistribution of the BCP material, with some BCP material being transported from the regions above photo-resist 2 into the photo-resist recesses 3, 4, 5. As can be seen from FIGS. 1D and 1E, depletion regions 7 are formed where the BCP material has been removed from the photo-resist 2 in regions around the photo-resist recesses 3, 4, 5. The BCP material removed from the depletion regions 7 has been redistributed to the photo-resist recesses 3, 4, 5.

In FIG. 1D, it can also be seen that the isolated photo-resist recess 3 has a thicker layer of BCP than the layer which is formed in the group of photo-resist recesses 4, 5. Further, the photo-resist recess 5, which is surrounded by photo-resist recesses 4 has a thinner layer of BCP than the layer which is formed in the photo-resist recesses 4, or the isolated photo-resist recess 3.

It will be appreciated that if the separation between adjacent photo-resist recesses is greater than the size of the depletion regions (as is the case with photo-resist recess 3), then BCP material from the surrounding areas may be redistributed to within the photo-resist recess. However, if the separation between adjacent photo-resist recesses is smaller than the size of the depletion regions (as is the case with the photo-resist recess feature 5), then the photo-resist recesses will each receive less BCP from the top of surrounding photo-resist material.

The photo-resist recesses 4 are each closely adjacent to at least one other recess (the photo-resist recess 5). However, the photo-resist recesses 4 are not completely surrounded by photo-resist recesses, and so receive more BCP from the top of surrounding photo-resist 2 than is received by the photo-resist recess 5.

The photo-resist recess 3 contains more BCP material than the photo-resist recesses 4, which each contain more BCP material than the photo-resist recess 5, in spite of an initial uniform layer 6 of BCP material being deposited over each of the photo-resist recesses 3, 4, 5.

As is demonstrated above, the local density of lithography features on a substrate 1 can influence the thickness of the BCP layer which is formed during annealing and self-assembly. However, when creating BCP features on the surface of a substrate 1, it may be desirable to maintain a substantially uniform thickness in all areas of the substrate 1.

The use of BCP material may allow domains of component polymer materials to be self-assembled within a BCP feature. For example, the BCP deposited within photo-resist recess 5 can be seen to have formed distinct domains of polymer. A first type A polymer domain 8 is formed as a cylinder within a continuous type B polymer domain 9.

To guide this self-assembly, lateral dimensions are controlled by the spacing of photo-resist wall portions, while the BCP material thickness also influences the self-assembly process. Therefore, while the thickness of the BCP layer within photo-resist recess 5 may be optimized for the formation of distinct domains of type A and type B polymers, the thickness within photo-resist recesses 3 and 4 may be too thick to allow the self-assembly of type A and type B domains. Similarly, if the BCP film 6 was too thin, then distinct type A and type B domains may not be formed.

As such, using a known method, it may not be possible to achieve a thickness of BCP material sufficiently uniform across a substrate which has a distribution of local feature densities to promote successful self-assembly. Therefore, it may not be possible to create a graphoepitaxy lithography feature using a known method which can accommodate a distribution in feature densities across a single substrate.

It would be useful, for example, to be able to construct multiple BCP features on a substrate with a substantially uniform thickness especially where there is some variation in the local density of BCP features in any particular region.

It is an object of the invention, for example, to obviate or mitigate a disadvantage described herein, or some other disadvantage associated with the art, past, present or future.

According to an aspect, there is provided a method of forming a lithography feature, the method comprising:

providing at least one lithography recess on a substrate, the or each lithography recess comprising a side-wall and a base, with portions of the side-wall having a width therebetween;

providing at least one dummy recess on the substrate, the or each dummy recess comprising a side-wall and a base, with portions of the side-wall having a width therebetween;

providing a self-assemblable block copolymer (BCP) having first and second blocks in the or each lithography recess, in the or each dummy recess and on the substrate beyond the or each lithography recess and the or each dummy recess;

causing the self-assemblable block copolymer to migrate from a region surrounding the or each lithography recess and the or each dummy recess to within the or each lithography recess and the or each dummy recess;

causing the self-assemblable block copolymer to self-assemble into an ordered layer within the or each lithography recess, the layer comprising at least a first domain of first block and a second domain of second block; and selectively removing the first domain to form the lithography feature comprised of the second domain within the or each lithography recess, wherein the or each lithography recess has a greater width than the width of the or each dummy recess, wherein the width of the or each dummy recess is smaller than the minimum width required by the self-assemblable block copolymer to self-assemble, and wherein the or each dummy recess is within the region of the substrate surrounding the or each lithography recess from which the self-assemblable block copolymer is caused to migrate.

In an embodiment, at least one dummy recess is provided close enough to the lithography recess to cause some of the self-assemblable block copolymer (BCP) to migrate into the dummy recess, rather than into the lithography recess. The migration of the BCP to the dummy recess, rather than the lithography recess, may reduce the final thickness of the BCP within the lithography recess. This provides an advantage of allowing the thickness of the BCP layer within the lithography recess to be maintained at a desired level, enabling self-assembly of a lithography feature within the lithography recess in a predictable manner. The use of a dummy recess, which is too small to allow self-assembly to occur within the dummy recess itself, enables adjustment of the effective recess density and hence BCP layer thickness, without having any substantial effect on the density of lithography features which appear on the final substrate.

The following features are applicable to all the embodiments of the invention where appropriate. When suitable, combinations of the following features may be employed as part of an embodiment of the invention, for instance as set out in the claims. An embodiment of the invention is suitable for use in device lithography. For instance, an embodiment of the invention may be of use in patterning a substrate which is used to form a device, or may be of use in patterning an imprint template for use in imprint lithography (which may then be used to form devices).

Two or more dummy recesses may be provided. The dummy recesses may be arranged symmetrically around the or each lithography recess.

A symmetrical arrangement of the dummy recess around the or each lithography recess provides an advantage of promoting a substantially uniform and symmetrical distribution of BCP within the or each lithography recess.

The or each lithography recess may be used to form a contact hole. A contact hole may be a circular opening which allows access between non-adjacent layers on a substrate. The use of self-assembly of a BCP in a lithography recess to form a contact hole may allow a hole to be formed having a smaller lateral dimension than the dimensions of the lithography recess. The application of this self-assembly technique to the formation of a contact hole provides an advantage of reducing the dimension of the contact hole.

The or each dummy recess may be circular. The provision of a circular dummy recess allows the dummy recess to be positioned between features of any geometry so as to adjust the local density of recesses, and consequently to adjust the thickness of BCP within a lithography recess.

The or each dummy recess may be linear. The provision of a linear dummy recess, or trench, may allow the dummy recess to closely follow the geometry of a linear lithography recess so as to adjust the thickness of BCP within that lithography recess.

The lithography feature may have a minimum lateral dimension of 40 nm or less. The lithography feature may have a minimum lateral dimension of 5 nm or more. The lithography feature formed by the self-assembly of BCP may allow the definition of a smaller lithography feature than would be defined by a conventional lithography method alone. The use of self-assembly of a BCP may allow the definition of a lithography feature with more uniformity than would be possible with a lithography feature defined by a conventional lithography technique at such small dimensions.

In order to direct self-assembly and reduce defects, the side-wall(s) may have a higher chemical affinity for one of the BCP domain types, such that, upon assembly, the BCP domain type having the higher chemical affinity with the side-wall is caused to assemble alongside that side-wall. Chemical affinity may be provided by utilizing a hydrophobic or hydrophilic side-wall feature.

Providing the layer of self-assemblable BCP in the recess may be carried out by spin coating of a solution of the BCP followed by removal of solvent.

The self-assemblable BCP may be caused to self-assemble by lowering the temperature to a temperature less than To/d for the BCP, to give an ordered layer of self-assembled BCP in the recess.

The substrate may be a semiconductor substrate, and may comprise a plurality of layers forming the substrate. For instance, the outermost layer of the substrate may be an ARC (anti-reflection coating) layer.

The outermost layer of the substrate may be neutral to the domains of the BCP, by which it is meant that it has a similar chemical affinity for each of the domain types of the BCP. The neutral orientation layer may, for example, be created by use of random copolymer brushes. Alternatively, an orientation control layer may be provided as an uppermost or outermost surface layer of the substrate to induce a desired orientation of the self-assembly pattern in relation to the substrate.

The recesses may be formed by photolithography, for instance with actinic radiation such as UV, EUV or DUV (deep UV) radiation.

The recesses may, for example, be formed in resist. The recesses may, for example, be formed on a substrate surface (e.g. having been transferred from resist onto the substrate). The recess may, for example, be formed in a film stack (e.g. having been transferred from resist onto the film stack).

The height of the recesses may be of the order of the thickness of the BCP layer to be ordered. The height of the recesses may for example be from about 20 nm to about 150 nm (e.g. about 100 nm).

The or each lithography recess may be circular. The self-assemblable block copolymer may be adapted to form an ordered layer having a cylindrical first domain of the first block in a cylindrical arrangement surrounded by a second continuous domain of the second block, the cylindrical first domain being oriented substantially perpendicular to the substrate. The use of a circular lithography recess allows the definition of a circular lithography feature.

The or each lithography recess may be linear. The self-assemblable block copolymer may be adapted to form a lamellar ordered layer wherein the first domains are lamellae alternating with second domains which are also lamellae, the lamellae of the first and second domains being orientated with their planar surfaces lying substantially perpendicular to the substrate and parallel to the lithography recess walls. The use of a linear lithography recess allows the definition of a linear lithography feature.

Selectively removing one of the domains may be achieved by etching, wherein the ordered layer of self-assembled BCP acts as a resist layer for etching a lithography feature within the recess on the substrate. Selective etching can be achieved by utilizing polymers having different etch resist properties and by selection of an etchant capable of selectively etching certain of the polymer domains. Selective removal may alternatively or additionally be achieved, for instance, by selective photo-degradation or photo-cleavage of a linking agent between blocks of the copolymer and subsequent solubilization of one of the blocks.

According to an aspect, there is provided a method of forming at least one lithography feature on a substrate, the substrate comprising at least one lithography recess, the or each lithography recess comprising a side-wall and a base, with portions of the side-wall having a width therebetween and at least one dummy recess, the or each dummy recess comprising a side-wall and a base, with the portions of the side-wall having a width therebetween, wherein the or each lithography recess has a greater width than the width of the or each dummy recess, the method comprising:

providing a self-assemblable block copolymer having first and second blocks in the or each lithography recess, in the or each dummy recess and on the substrate between and around the or each lithography recess and the or each dummy recess;

causing the self-assemblable block copolymer to migrate from the region surrounding the or each lithography recess and the or each dummy recess to within the or each lithography recess and the or each dummy recess;

causing the self-assemblable block copolymer to self-assemble into an ordered layer within the or each lithography recess, the layer comprising at least a first domain of first block and a second domain of second block; and selectively removing the first domain to form the at least one lithography feature comprised of the second domain within the or each lithography recess, wherein the width of the or each dummy recess is smaller than the minimum width required by the self-assemblable block copolymer to self-assemble, and wherein the or each dummy recess is within the region of the substrate surrounding the or each lithography recess from which the self-assemblable block copolymer is caused to migrate.

According to an aspect, there is provided a substrate comprising at least one lithography recess, the or each lithography recess comprising a side-wall and a base, with portions of the side-wall having a width therebetween, and at least one dummy recess, the or each dummy recess comprising a side-wall and a base, with portions of the side-wall having a width therebetween, wherein the or each lithography recess has a greater width than the width of the or each dummy recess, wherein the width of the or each dummy recess is smaller than the minimum width required, in use, by a self-assemblable block copolymer having first and second blocks to self-assemble, and wherein the or each dummy recess is arranged within a region of the substrate surrounding the or each lithography recess from which, in use, the self-assemblable block copolymer may be caused to migrate.

An embodiment of the present invention relates to a lithography method. The method may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

The methods described herein may be useful for forming a contact hole providing access between layers of a semiconductor device.

The self-assemblable BCP may be a BCP as set out herein comprising at least two different block types, referred to as first and second polymer blocks, which are self-assemblable into an ordered polymer layer having the different block types associated into first and second domain types. The BCP may comprise di-block copolymer, a tri-block copolymer, and/or a multi-block copolymer. Alternating or periodic BCPs may also be used in the self-assemblable BCP.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis substantially normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

In this specification "recess" is not intended to imply a particular shape. The term "recess" may be interpreted as meaning a lithography feature formed on the surface of a substrate, which has a depth and one or more side-walls. A recess may, for example, be circular in shape, for example defining a contact hole, having a diameter or width and having a side-wall which, in cross-section, appears vertical. A recess may be linear in shape, for example defining a trench, having side-walls which are separated by a width in a first direction, and extend in an elongate manner in a second direction. It will be appreciated that a recess may take any other convenient form, and may include linear or curved sections. A lithography feature may comprise one or more recesses. The term "lithography recess" may be interpreted as meaning a recess which is intended to result in the production of a lithography feature. The term "dummy recess" may be interpreted as meaning a recess which is not intended to result in the production of a lithography feature, but is instead intended to modify the local density of recesses.

In this specification, the term "substrate" is meant to include any surface layer forming part of the substrate, or being provided on a substrate, such as one or more planarization layers or anti-reflection coating layers which may be at, or form, the surface of the substrate, or may include one or more other layers such as those specifically mentioned herein.

In this specification, the term "lateral" may be interpreted as meaning in the plane of the surface of a substrate. For example, the width or diameter of a recess may be considered to be a lateral dimension of that recess. The length of a recess may be considered to be a lateral dimension of that recess. However, the depth of a recess would not be considered to be a lateral dimension of that recess.

One or more aspects of the invention may, where appropriate to one skilled in the art, be combined with any one or more other aspects described herein, and/or with any one or more features described herein.

BRIEF DESCRIPTION OF THE DRAWINGS

Specific embodiments of the invention will be described with reference to the accompanying Figures, in which.

DETAILED DESCRIPTION

The described and illustrated embodiments are to be considered as illustrative and not restrictive in character, it being understood that only embodiments have been shown and/or described and that all changes and modifications that come within the scope of the inventions as defined in the claims are desired to be protected.

Figure 1A:
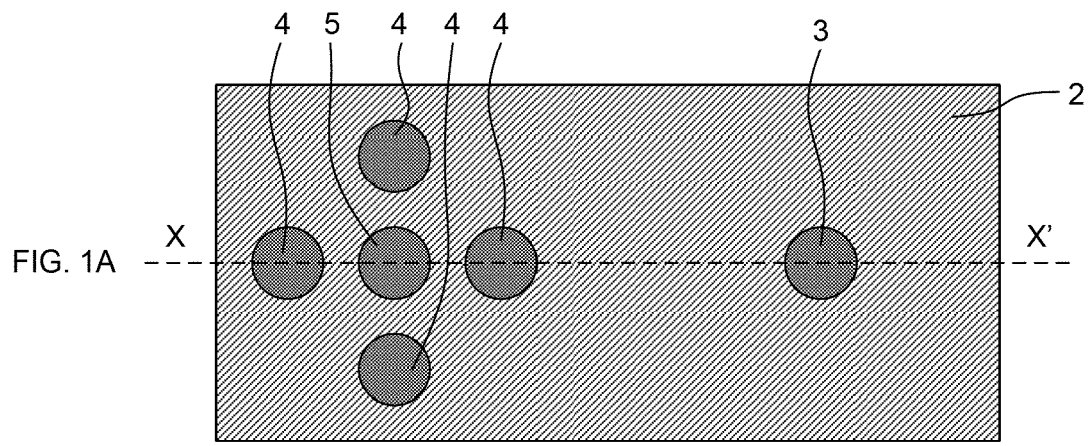
FIGS. 1A-1E schematically depict directed self-assembly of A-B block copolymer onto a substrate by graphoepitaxy.
Figure 1B:
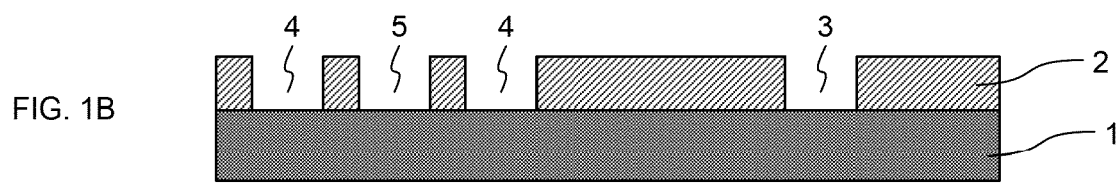
Figure 1C:
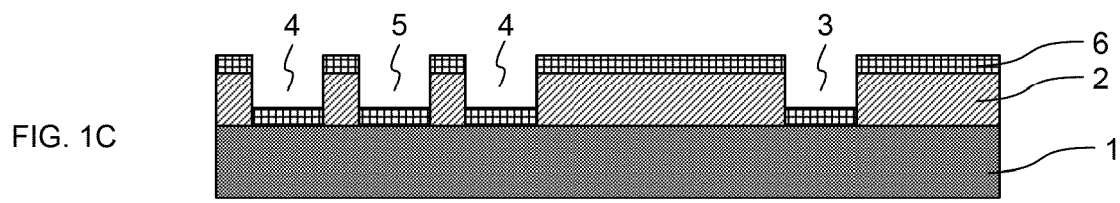
Figure 1D:
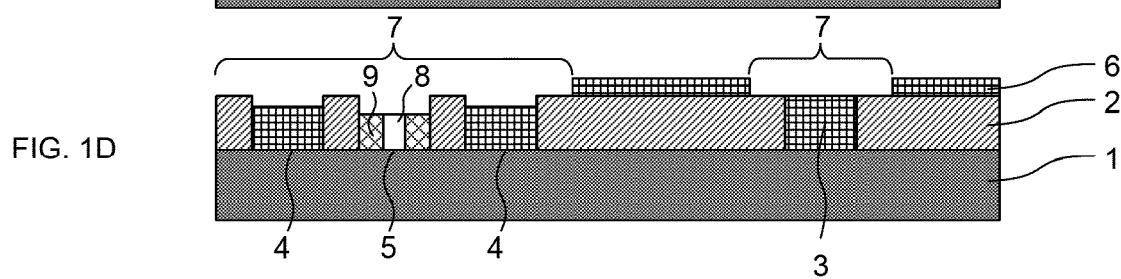
Figure 1E:
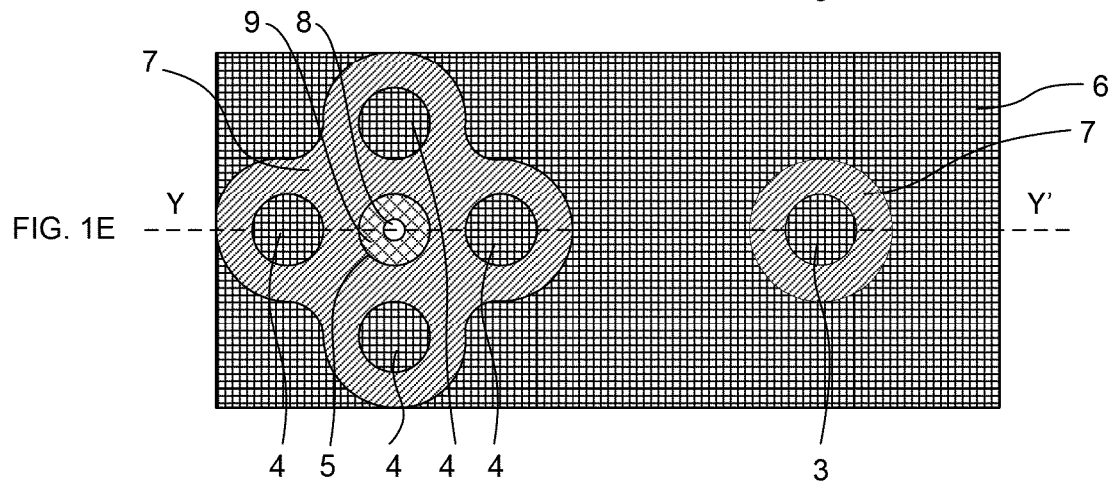
Figure 2A:
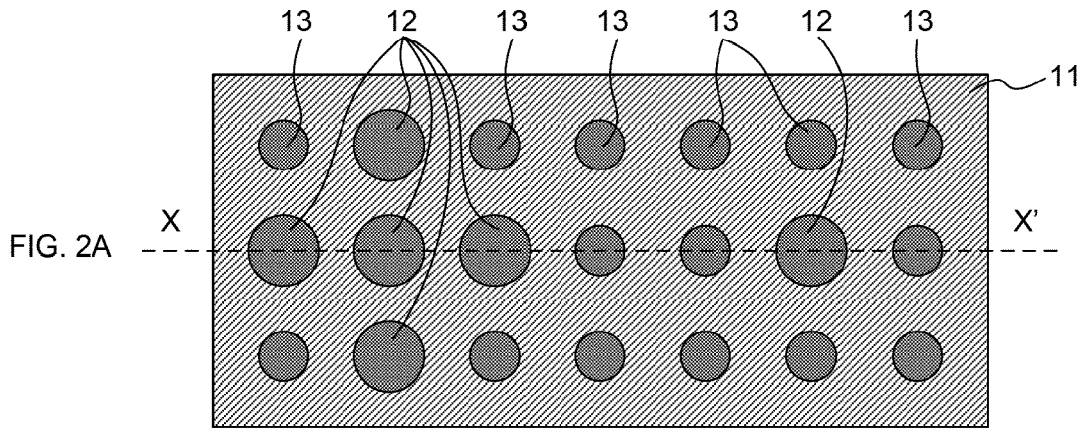
FIGS. 2A-2E schematically depict directed self-assembly of A-B block copolymer onto a substrate by graphoepitaxy using lithography and dummy recesses according to an embodiment of the invention.
Figure 2B:
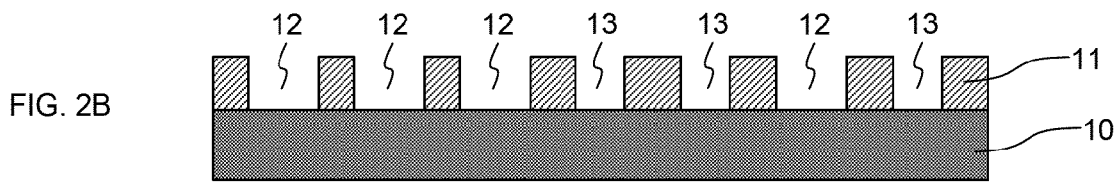

FIGS. 2A and 2B show, in plan view and cross-section respectively, a substrate 10 on which a layer of photo-resist 11 is provided. The layer of photo-resist 11 is patterned with a plurality of contact hole resist recesses 12 and a plurality of dummy recesses 13. The contact hole resist recesses 12 and dummy recesses 13 appear as recesses in cross-section, as shown in FIG. 2B. The contact hole resist recesses 12 are examples of lithography recesses. The dummy recesses 13 are intended to modify the local density of recesses.

Figure 2C:
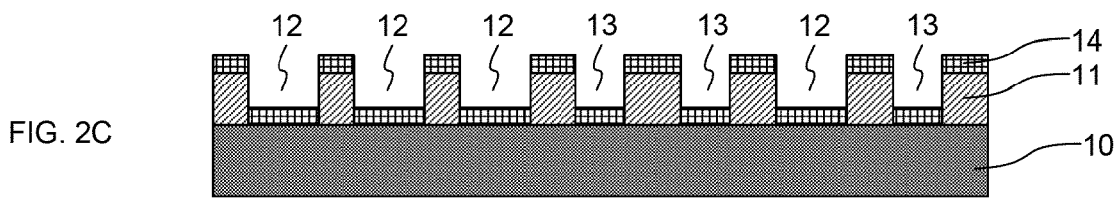
Figure 2D:
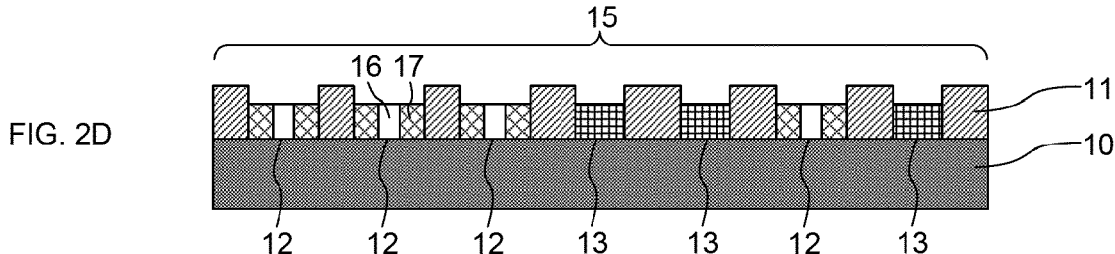
Figure 2E:
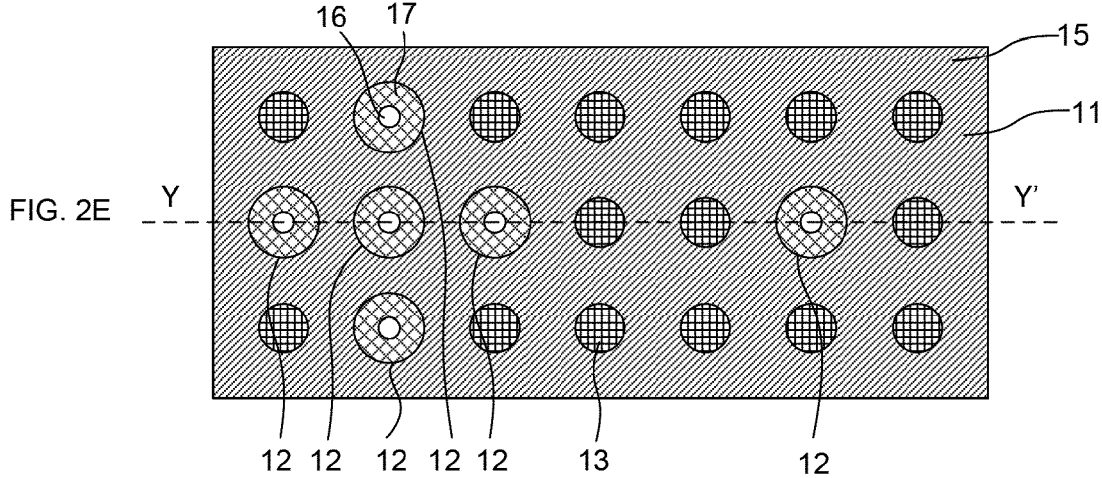

In FIG. 2C, a self-assemblable A-B block copolymer (BCP) layer 14 has been deposited onto the substrate 10 and the photo-resist 11. The BCP layer 14 is shown with a uniform thickness within each of the photo-resist recesses 12, 13 and on top of the photo-resist 11. In FIGS. 2D and 2E, which show a cross-sectional and plan view respectively, the BCP layer 14 has been thermally annealed. The thermal annealing process causes redistribution and self-assembly of the BCP material. The redistribution of the BCP material results in some BCP material being transported from the regions above the photo-resist 11 into the photo-resist recesses 12, 13. A depletion region 15 is formed around each of the photo-resist recesses 12, 13, where BCP material is transported away from the photo-resist and into the photo-resist recesses. In FIGS. 2D and 2E, the depletion region 15 extends across the whole substrate 10.

As can be seen in FIGS. 2D and 2E, both contact hole resist recesses 12 and dummy recesses 13 receive BCP material from the surrounding areas of photo-resist 11, forming the depletion region 15. However, the relatively small width of the dummy recesses 13 essentially prevents phase separation and self-assembly within the BCP material. As can be seen within the contact hole resist recesses 12, the BCP material self-assembles to form domains of A block 16 (unhatched) and domains of B block 17 (hatched). Domains of A blocks 16 and B blocks domains 17 are formed within each of the contact hole resist recesses 12. The A block domains 16 are in a cylindrical arrangement, each A block domain 16 being a cylinder surrounded by a continuous B block domain 17. The cylindrical A block domains 16 are oriented substantially perpendicular to the substrate 10.

The dimensions of resist recesses for use with directed self-assembly of BCP varies in dependence upon the particular BCP selected. For example, the length of the BCP polymer chains affects the recess dimensions at which phase separation and self-assembly occurs. A shorter length polymer chain is likely to result in a recess with a smaller dimension being suitable to direct self-assembly of that polymer chain.

For example, the BCP may comprise blocks of polystyrene (PS) wherein the total molecular weight of the PS is 68 kDa, and blocks of polymethylmethacrylate (PMMA) wherein the total molecular weight of the PMMA is 33 kDa. The use of this BCP (PS-PMMA: 68 kDa-33 kDa) may result in a threshold dimension for self-assembly in a circular contact hole resist recess of around 70 nm. For example, a dummy recess having a diameter of less than 70 nm (e.g. 65 nm) may not permit self-assembly, whereas a contact hole recess having a diameter of greater than 70 nm (e.g. 75 nm) may permit self-assembly.

A BCP system having a lower degree of polymerization (lower N value) and consequently having smaller molecular weight blocks (e.g. PS-PMMA: 26.8 kDa-12.2 kDa) may have a smaller self-assembly threshold dimension.

Alternatively, or additionally, the use of BCP material with a high chi value may allow self-assembly threshold dimensions to be reduced further. According to Flory-Huggins theory, it is expected that polymers will self-assemble if N*chi is greater than about 10.5, for a lamellar phase. For a cylindrical phase, it is estimated that N*chi should be above around 15 for self-assembly. For N*chi values below these thresholds BCPs will preferentially mix, rather than phase separate. Therefore, increasing the chi value allows the self-assembly threshold dimensions to be reduced.

Increasing the chi value of the BCP material allows the use of lower N values, and smaller (lower molecular weight) block copolymers, for a given self-assembly threshold dimension.

In more general terms, the self-assembly of BCP is governed by phase separation. The periodicity of phase separation in BCPs has been reported to range from about 10 nm to about 150 nm. For directed self-assembly use in conjunction with resist recesses formed in common photolithography resists, the dimensions of a lithography recess are typically about 1.2 to 2.1 times the periodicity of the phase separation of a particular PS-PMMA BCP. Therefore, the one or more dummy recesses should have a size which is below this range so as to avoid self-assembly in the dummy recess. In such a recess (i.e. with a size below this range) the PS-PMMA BCP would mix rather than phase separate. However, it will be appreciated that for other BCPs or other resists this ratio may be different.

The self-assemblable A-B block copolymer may have hydrophilic A block (unhatched) and hydrophobic B block (hatched). The hydrophobic B block has a high affinity for the sidewall of the recess, whereas the hydrophilic A block has a high affinity for other A block. Therefore, during the annealing process, the ordered layer of BCP has formed with cylindrical domains of hydrophilic A block, surrounded by domains of B block, which are in contact with the recess sidewall.

In subsequent processing steps (not shown) domains of A block 16 can be selectively removed by any technique. Such selective removal of A block domains 16 exposes the substrate 10 below the A block domains 16. However, B block domains 17 will not be removed by the process which removed the A block domains 16, due to the selectivity of the etching process. Further, the BCP material in the dummy recesses 13, which has not formed discrete A and B block domains, will not be removed by the type A selective etch process. In this way, it is possible to remove only regions of type A polymer, with all other areas of the substrate 10 being covered by either B block domains 17, mixed BCP material, or photo-resist 11.

The remaining B block feature(s) may subsequently be used as a mask defining an opening which can be etched. For example, contact holes may subsequently be etched in the substrate 10 as defined by the relatively small opening presented by the removed A block domains. This process allows a higher resolution to be achieved than could be achieved by conventional photo-resist patterning techniques, the dimensions of the lithographically defined contact hole resist recesses 12 directing the self-assembly of the BCP to create a smaller region of A block domains 16.

Selective etching is achieved due the relative susceptibility towards etching, with the A block being relatively prone to etching, while the B block is relatively resistant to etching. Selective removal may also be achieved, for instance, by selective photo-degradation or photo-cleavage of a linking agent between blocks of the copolymer and subsequent solubilization of one of the blocks. An embodiment of the invention allows for formation, onto a substrate, of a feature which has a critical dimension which is smaller than that of the recess which directs the self-assembly, allowing a feature of the order of a few nm to be created with a smallest lithographically defined recess of the order of a few tens of nm. For example, the use of a lithographically defined circular recess having a diameter of 70 nm may result in a contact hole feature having a diameter of the order of 15-30 nm. Features with a minimum dimension of 5 nm with a periodicity of 11 nm may be formed.

In an embodiment (not illustrated) the etching (or other removal process) may etch into the substrate. Following this the type A domains may be removed, leaving behind a regularly spaced array of lithography features formed in the substrate, with a critical dimension which is smaller than the minimum dimension which can be achieved by the photolithography feature which was used to define the recesses.

An embodiment of the present invention may overcome a problem which was illustrated in FIG. 1. By way of contrast with the method illustrated in FIG. 2, FIG. 1 shows a substrate 1 on which several contact hole resist recesses 3, 4, 5 are defined. However, as is described above, and can be seen in FIGS. 1D and 1E, the thickness of the BCP material varies between recesses 3, 4 and 5, depending on the local area density of lithography recesses. The self-assembly of BCP is highly sensitive to the thickness of the BCP material. Using the process of FIG. 1, it may therefore not be possible to achieve a sufficiently uniform BCP layer thickness, to allow the directed self-assembly of polymer domains within each of the lithography recesses 3, 4 and 5. This problem may be overcome in the method illustrated by FIG. 2, by the use of a dummy recess.

In a particular lithography process, if the BCP layer thickness varies with printed feature density it may not be possible to reliably create well defined domains of a particular polymer block as is required by the self-assembly process. Therefore one or more dummy recesses are added to the mask design to provide control over the BCP layer thickness.

An optimal BCP layer thickness may exist for each BCP material used. Any thickness which is significantly above, or below, this optimal layer thickness may result in imperfect self-assembly. For example, the optimal BCP layer thickness for self-assembly in an isolated resist trench may be 33 nm. However, a BCP layer thickness of 31 nm or 35 nm may result in defective self-assembly. In such cases, the BCP material may self-assemble, but with an alternative orientation to that which is desired, or which is achieved with a BCP thickness of 33 nm. Any such variation in the self-assembly process may result in the resulting lithography feature being improperly formed.

The use of one or more dummy recesses allows some control over the local density of recesses on a substrate, without having to adjust the density of features which appear on the final device. A dummy recess can thus enable directed self-assembly to be used to reduce a minimum feature size and improve critical dimension uniformity.

The distribution of the one or more dummy recesses can be determined to ensure that the or each lithography recess is surrounded with one or more other recesses, whether a dummy recess or otherwise. The aim is to ensure that the local recess density for each lithography recess is approximately equal to the local recess density of each other lithography recess on the substrate. Recesses which are surrounded by one or more other recesses (high density of recesses) may be less sensitive to BCP layer thickness variation than an isolated recess.

For proper control of self-assembly, it is expected that optimal BCP layer thickness will be related to the periodicity of the phase separation of a particular BCP. Suitable layer thicknesses and tolerances may be determined by the skilled person through routine experimentation. Achieving a BCP thickness within an acceptable range allows some degree of freedom in the placement of a dummy recess. In particular, this tolerance permits some degree of variation in the corrected local feature density.

To determine where a dummy recess can be successfully used, the local density of features on a substrate may be considered. Additionally the size of the depletion zone formed around each recess may have an effect on the extent to which the thickness of the BCP layer is altered during processing.

The redistribution of BCP material into the recesses and the formation of the depletion zone are related to the mobility of the block copolymer chains. It is therefore expected that the size of the depletion zone is dependent on the type and also length of the block copolymer. Small length polymers will have a higher mobility than longer polymers. Additionally the Flory-Huggins parameter chi will affect the mobility of the BCP chains. The annealing time will also have an effect on the size of the depletion zone. A longer annealing time will result in a larger depletion zone.

The thickness of the BCP layer after thermal annealing compared to the initial BCP layer thickness is defined as the relative layer thickness. The relative layer thickness may depend on the recess's size, the local recess density, the size of the depletion zone (which itself depends on several parameters as discussed above) and also on the thickness of both the BCP layer and the resist layer.

For example, considering a single isolated linear recess (or trench) on a substrate, the relative layer thickness of BCP within the trench can be calculated by Equation (1):

$$RLT = \frac{w_{DEPLETION\ ZONE}}{w_{TRENCH}} \quad (1)$$

where:
RLT is the relative layer thickness,
$w_{DEPLETION\ ZONE}$ is the width of the depletion zone (including the trench width), and
$w_{TRENCH}$ is the width of the trench.

It can be seen from Equation (1) that for a single isolated recess on a substrate the relative layer thickness is only influenced by the width of the recess (trench) and the width of the depletion zone (although the depletion zone width will depend on several other parameters, such as BCP mobility and BCP layer thickness). However, in a more complex layout, the relative layer thickness of the BCP layer will also depend on the spacing between adjacent recesses.

For example, in such a more complex layout, a recess which is a circular hole may form part of a dense hexagonal array of similar recesses (circular holes), where the spacing between adjacent holes (periodicity) is smaller than the depletion zone. The relative layer thickness may be calculated according to Equation (2):

$$RLT = \frac{P^2 \sqrt{3}}{2\pi R^2} \quad (2)$$

where:
P is the periodicity of the holes, and
R is the radius of each of the holes.

It can be seen from Equation (2) that for a circular hole which is part of a dense array of holes, the depletion zone width does not influence the relative layer thickness. However, the relative layer thickness of a hole which is at the perimeter of such a dense array of holes would be influenced by the depletion zone width.

It will be appreciated that the relative layer thickness for recesses within alternative layouts can be calculated according to simple geometrical relationships.

The placement and density of one or more dummy recesses should be sufficiently close to the one or more lithography recesses that it will have some effect on the relative layer thickness. However, the placement and density of the one or more dummy recesses should not be so close that relative layer thickness within the one or more lithography recesses becomes too thin. The one or more dummy recesses should be placed within the depletion zone around a lithography recess.

In practical applications, the relative layer thickness within a lithographically defined pattern for directed self-assembly may vary between 1 and 20. In most cases, the relative layer thickness varies between 1 and 5. It will be appreciated that this wide variation in relative layer thickness may prevent the effective self-assembly of discrete polymer block domains within a BCP layer. A substantially uniform and predictable BCP layer thickness is desired to help ensure predictable self-assembly of discrete polymer block domains.

The migration and self-assembly of a BCP material has been described above with reference to an annealing process, and in particular a thermal annealing process. However, other forms of annealing may facilitate the migration or self-assembly of BCP molecules. For example, solvent vapor annealing with an appropriate solvent may sufficiently increase the mobility of BCP molecules to allow a degree of migration or self-assembly.

Further, while the migration of BCP material has been described during an annealing process, this can also occur during spin-coating. When a BCP layer is applied by spin coating, a solution with approximately 2% BCP dissolved in a solvent is deposited on to a substrate. The solvent will subsequently evaporate, leaving a residue of BCP material on the surface of the substrate. However, as the solvent evaporates the BCP material may be relatively mobile on the surface of the substrate, enabling some migration of the BCP material from the surface of photo-resist, to the recesses. In this way non-uniform BCP layer thickness may be encountered without performing an annealing step. An embodiment of the present invention may be applied to solve the problem of non-uniform BCP layer thickness encountered in this way.

A complete depletion zone is not required for non-uniform thickness to occur across the surface of a substrate. For example, the thickness of BCP above a photo-resist layer may be significantly reduced, with BCP material being transported to recesses or other features, without the BCP material above the photo-resist layer being entirely removed.

FIG. 2 shows one possible layout of dummy recesses. However, it will be appreciated that other layouts are possible. Dummy recesses may be used around in any arrangement in which the dummy recesses provide some adjustment to the local lithography recess density on a substrate.

Figure 3:
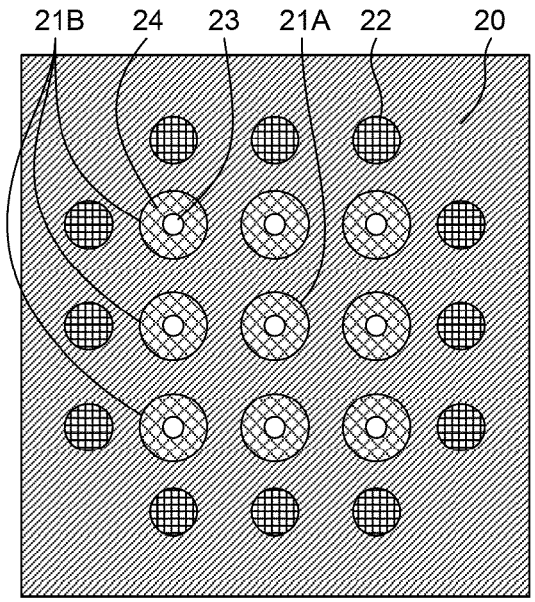
FIG. 3 is a schematic representation of a substrate having lithography and dummy recesses according to an embodiment of the invention.

For example, FIG. 3 shows a substrate 20 with an array of lithography recesses 21A, 21B. Like features are again shown with like shading. A plurality of circular dummy recesses 22 are provided around the perimeter of the array of lithography recesses 21A, 21B. The central lithography recess 21A is surrounded by peripheral lithography recesses 21B. Without the addition of dummy recesses 22, the central lithography recess 21A would have a higher local recess density than each of the peripheral lithography recesses 21B. The dummy recesses 22 have the effect of increasing the local recess density at each of the peripheral lithography recesses 21B, resulting in a more uniform BCP layer thickness within the lithography recesses 21A, 21B. The BCP material within recesses 21A, 21B has self-assembled to form discrete A block domains 23 and B block domains 24. There is no self-assembly of BCP within the dummy recesses 22, due to their size being below the threshold at which self-assembly can occur.

Figure 4:
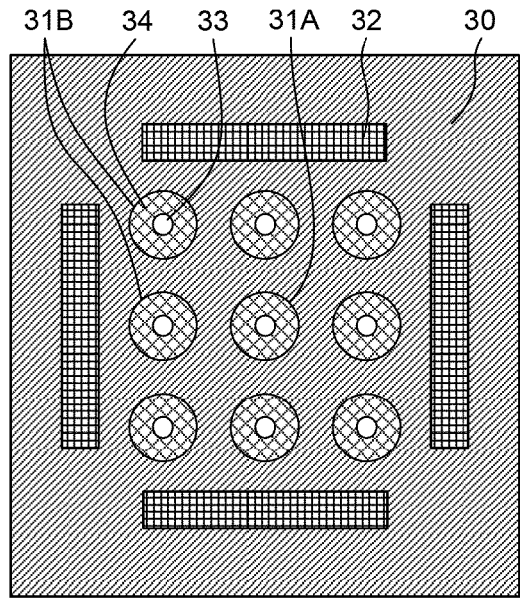
FIG. 4 is a schematic representation of a substrate having lithography and dummy recesses according to an embodiment of the invention.

In a further embodiment, FIG. 4 shows a substrate 30 having an array of lithography recesses 31A, 31B, in which dummy recesses 32 are arranged as trenches around the array of lithography recesses 31A, 31B. The central lithography recess 31A is surrounded by peripheral lithography recesses 31B. Without the addition of dummy recesses 32, the central lithography recess 31A would have a higher local recess density than each of the peripheral lithography recesses 31B. The dummy recesses 32 have the effect of increasing the local recess density at each of the peripheral lithography recesses 31B, resulting in a more uniform BCP layer thickness within the lithography recesses 31A, 31B. The BCP material within recesses 31 has self-assembled to form discrete A block domains 33 and B block domains 34. There is no self-assembly of BCP within the dummy recesses 32, due to their size being below the threshold at which self-assembly can occur.

Figure 5:
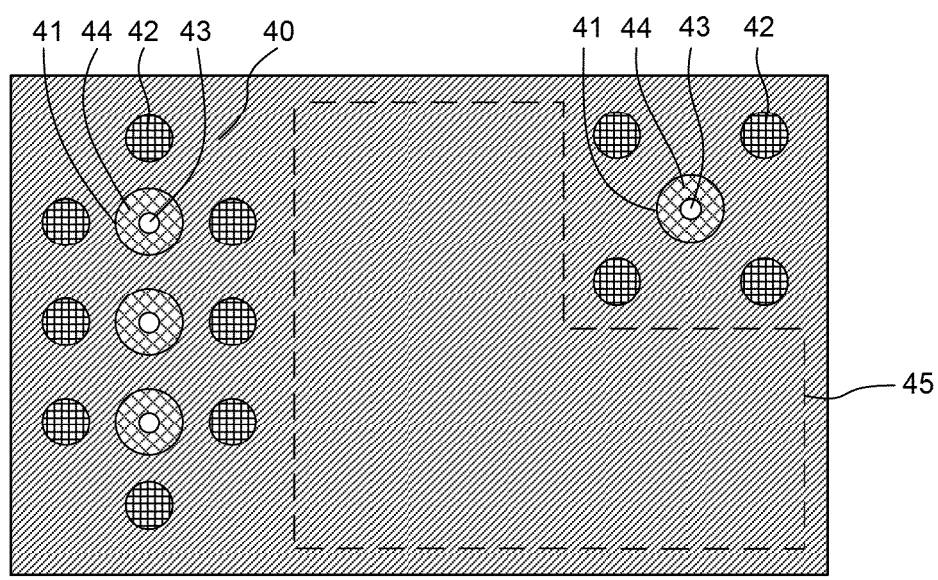
FIG. 5 is a schematic representation of a substrate having lithography and dummy recesses according to an embodiment of the invention.

While one or more dummy recesses may be used in proximity to lithography recesses on a device, a dummy recess is not necessarily required in all areas of a device. For example, FIG. 5 shows a lithography pattern 40 in which lithography recesses 41 are surrounded by dummy recesses 42. The BCP material within recesses 41 has self-assembled to form discrete A block domains 43 and B block domains 44. There is no self-assembly of BCP within the dummy recesses 42, due to their size being below the threshold at which self-assembly can occur. However, in regions of the pattern in which there are no lithography recesses present, such as the region shown by dotted line 45, no dummy recess is required. In the region shown by line 45 the BCP layer will not self-assemble, as there are no recesses to direct the self-assembly process. Therefore there is no reason to control the BCP layer thickness in this region.

Figure 6:
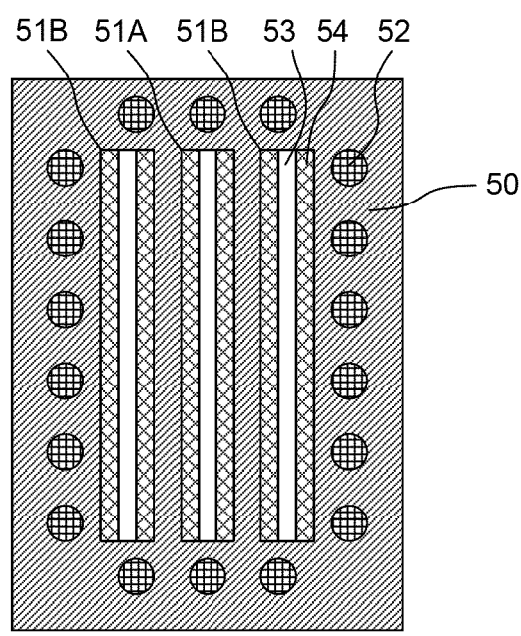
FIG. 6 is a schematic representation of a substrate having lithography and dummy recesses according to an embodiment of the invention.

FIG. 6 shows a substrate 50 with linear lithography recesses 51A 51B. Dummy recesses 52 surround the lithography recesses 51A, 51B. The BCP material within the recesses 51A, 51B has self-assembled to form discrete A block domains 53 and B block domains 54. There is no self-assembly of BCP within the dummy recesses 52, due to their size being below the threshold at which self-assembly can occur.

In contrast to the earlier embodiments, the A block domains 53 and B block domains 54 within lithography recesses 51A, 51B are shown in a lamellar arrangement. The elongate arrangement of recesses 51A, 51B guides the self-assembly of the BCP to form B-block domains 54 at the edges of the recesses 51 with a single A-block domain 53 running along the center of each of the elongate recesses 51A, 51B. The lamellae of the A-block and B-block domains 53, 54 are orientated with their planar surfaces lying substantially perpendicular to the substrate and substantially parallel to the recess walls. The dummy recesses 52 have the effect of increasing the local recess density around the lithography recesses 51, resulting in a more uniform BCP layer thickness within the lithography recesses 51A, 51B. Alternatively, there may be a plurality of A-block domains which are lamellae alternating with B-block domains which are also lamellae.

Without the dummy recesses 52, the central lithography recess 51A would have a higher local recess density than each of the outer lithography recesses 51B. Consequently, the outer lithography recesses 51B would have a thicker BCP layer than the central lithography recess 51A. Therefore, the dummy recesses 52 result in a more uniform local recess density, and consequently a more uniform BCP layer thickness within the lithography recesses 51A, 51B.

Alternative lithography and dummy recess geometries are possible beyond the circular and elongate examples discussed above. For example, trenches may be used for both lithography recesses (as shown in FIG. 6) and for dummy recesses (as shown in FIG. 4). Any recess geometry which promotes self-assembly of BCP may be used for a lithography recess. Similarly, any recess geometry which does not allow self-assembly of BCP may be used for a dummy recess.

It will be appreciated that the use of resist (also known as photo-resist) to form the sidewall of the lithography and dummy recesses is intended to be an example, rather than a limiting feature. For example, recesses may be provided by patterning of the substrate itself, or patterning of a layer deposited or grown onto the substrate. The recesses may themselves be provided by the self-assembly of a BCP material.

The invention claimed is:

1. A method of forming a lithography feature, the method comprising:
    providing a self-assemblable block copolymer having first and second blocks in a lithography recess of a substrate, in a dummy recess of the substrate and on the substrate beyond the lithography recess and the dummy recess;
    causing the self-assemblable block copolymer to migrate from a region surrounding the lithography recess and the dummy recess to within the lithography recess and the dummy recess;
    causing the self-assemblable block copolymer to self-assemble into an ordered layer within the lithography recess, the layer comprising a first domain of the first block and a second domain of the second block; and
    selectively removing the first domain to form the lithography feature comprising the second domain within the lithography recess,
    wherein the lithography recess has a greater width between portions of side-wall of the lithography recess than a width between portions of side-wall of the dummy recess,
    wherein the width of the dummy recess is smaller than the minimum width required by the self-assemblable block copolymer to self-assemble, and
    wherein the dummy recess is within the region of the substrate surrounding the lithography recess from which the self-assemblable block copolymer is caused to migrate.

2. The method according to claim 1, wherein the substrate has two or more dummy recesses, the dummy recesses arranged symmetrically around the lithography recess.

3. The method according to claim 1, wherein the lithography recess is used to form a contact hole.

4. The method according to claim 1, wherein the dummy recess is circular.

5. The method according to claim 1, wherein the dummy recess is linear.

6. The method according to claim 1, wherein the lithography feature has a minimum lateral dimension of 40 nm or less.

7. The method according to claim 1, wherein the lithography feature has a minimum lateral dimension of 5 nm or more.

8. The method according to claim 1, wherein the side-wall of the lithography recess has a higher chemical affinity for one of the blocks.

9. The method according to claim 1, wherein the side-walls are formed using photolithography.

10. The method according to claim 1, wherein the side-walls are sized to have a height of between 20 nm and 150 nm.

11. The method according to claim 1, wherein the lithography recess is circular.

12. The method according to claim 11, wherein the self-assemblable block copolymer is adapted to form an ordered layer having cylindrical first domains of the first block in a cylindrical arrangement surrounded by a second continuous domain of the second block, the cylindrical first domain being oriented substantially perpendicularly to the substrate.

13. The method according to claim 1, wherein the lithography recess is linear.

14. The method according to claim 13, wherein the self-assemblable block copolymer is adapted to form a lamellar ordered layer wherein the first domains are lamellae alternating with second domains which are also lamellae, the lamellae of the first and second domains orientated with their planar surfaces lying substantially perpendicular to the substrate and substantially parallel to the side-wall of the lithography recess.

15. The method according to claim 1, wherein one of the domains is selectively removed by etching.

16. The method according to claim 1, wherein one of the domains is selectively removed by photo-degradation or photo-cleavage.

17. The method according to claim 1, wherein the recesses are formed in resist.

18. A method of forming a lithography feature on a substrate, the substrate comprising a lithography recess, the lithography recess comprising a side-wall having a width between portions thereof, and a dummy recess, the dummy recess comprising a side-wall having a width between portions thereof, wherein the width of the lithography recess is greater than the width of the dummy recess, the method comprising:
    causing a self-assemblable block copolymer having first and second blocks to migrate from a region surrounding the lithography recess and the dummy recess to within the lithography recess and the dummy recess;
    causing the self-assemblable block copolymer to self-assemble into an ordered layer within the lithography recess, the layer comprising a first domain of the first block and a second domain of the second block; and
    selectively removing the first domain to form the lithography feature comprising the second domain within the lithography recess,
    wherein the width of the dummy recess is smaller than the minimum width required by the self-assemblable block copolymer to self-assemble, and
    wherein the dummy recess is within the region of the substrate surrounding the lithography recess from which the self-assemblable block copolymer is caused to migrate.

19. A substrate comprising:
    a lithography recess, the lithography recess comprising a side-wall having a width between portions thereof; and
    a dummy recess, the dummy recess comprising a side-wall having a width between portions thereof,
    wherein the lithography recess has a greater width than the width of the dummy recess, wherein the width of the dummy recess is smaller than the minimum width required, in use, by a self-assemblable block copolymer having first and second blocks to self-assemble, and
    wherein the dummy recess is arranged within a region of the substrate surrounding the lithography recess from which, in use, the self-assemblable block copolymer may be caused to migrate.

* * * * *